(12) United States Patent
Vukosic et al.

(10) Patent No.: US 7,513,659 B2
(45) Date of Patent: Apr. 7, 2009

(54) LIGHT EMITTER SUB-ASSEMBLIES ESPECIALLY CONTAINING AN ARRAY OF LIGHT EMITTING DEVICES (LEDS) AND MODULES CONTAINING SUCH SUB-ASSEMBLIES WHICH PROVIDE LIGHTING APPARATUSES, ESPECIALLY LIGHT BARS FOR MOUNTING ON A VEHICLE

(75) Inventors: Stephen T. Vukosic, W. Henrietta, NY (US); R. Michael Datz, Rochester, NY (US); Orinna J. Starr, Catskill, NY (US)

(73) Assignee: Star Headlight & Lantern Co., Inc., Avon, NY (US)

( * ) Notice: Subject to any disclaimer, the term of this patent is extended or adjusted under 35 U.S.C. 154(b) by 0 days.

(21) Appl. No.: 11/515,484

(22) Filed: Sep. 1, 2006

(65) Prior Publication Data
US 2007/0047238 A1    Mar. 1, 2007

Related U.S. Application Data

(60) Provisional application No. 60/713,612, filed on Sep. 1, 2005.

(51) Int. Cl.
*F21V 29/00* (2006.01)
(52) U.S. Cl. ................ 362/373; 362/294; 362/547
(58) Field of Classification Search ........ 362/373, 362/294, 547, 227, 800, 218, 264, 345, 249, 362/580, 126
See application file for complete search history.

(56) References Cited

U.S. PATENT DOCUMENTS

| 4,189,709 | A | 2/1980 | Gosswiller |
| 5,452,188 | A | 9/1995 | Green et al. |
| 5,884,997 | A | 3/1999 | Stanuch et al. |
| 7,244,058 | B2 * | 7/2007 | DiPenti et al. ............. 362/547 |
| 2004/0196663 | A1 | 10/2004 | Ishida et al. |
| 2005/0122724 | A1 * | 6/2005 | Hirata et al. ............... 362/345 |

* cited by examiner

*Primary Examiner*—Bao Q Truong
(74) *Attorney, Agent, or Firm*—Kenneth J. Lukacher; Martin Lukacher

(57) ABSTRACT

A sub-assembly for a light-projecting module has an array of LEDs mounted on a circuit board potted in a tray at the bottom thereof by a solidified body of potting material. The body of potting material and the tray are heat-conductive and serve to dissipate heat generated by the LEDs. A light-emitting module includes the sub-assembly and a reflector. The reflector has a base which is assembled in heat-conductive relationship with the tray, so as to facilitate dissipation of heat generated by the LEDs. The reflector is a parabolic reflector which collects light from the LEDs and projects the light as a beam. The reflector contains an optical element for concentrating or diffusing the light projected from the module. The module may be assembled in a housing having an opening through which the light projects so as to provide a light bar suitable for mounting on the dash or windshield of a vehicle. A plurality of modules may be assembled around the edge of a frame which is contained in a cover of translucent material, whereby light, which may be of different colors depending upon the LEDs, is projected omni-directionally through the cover.

5 Claims, 16 Drawing Sheets

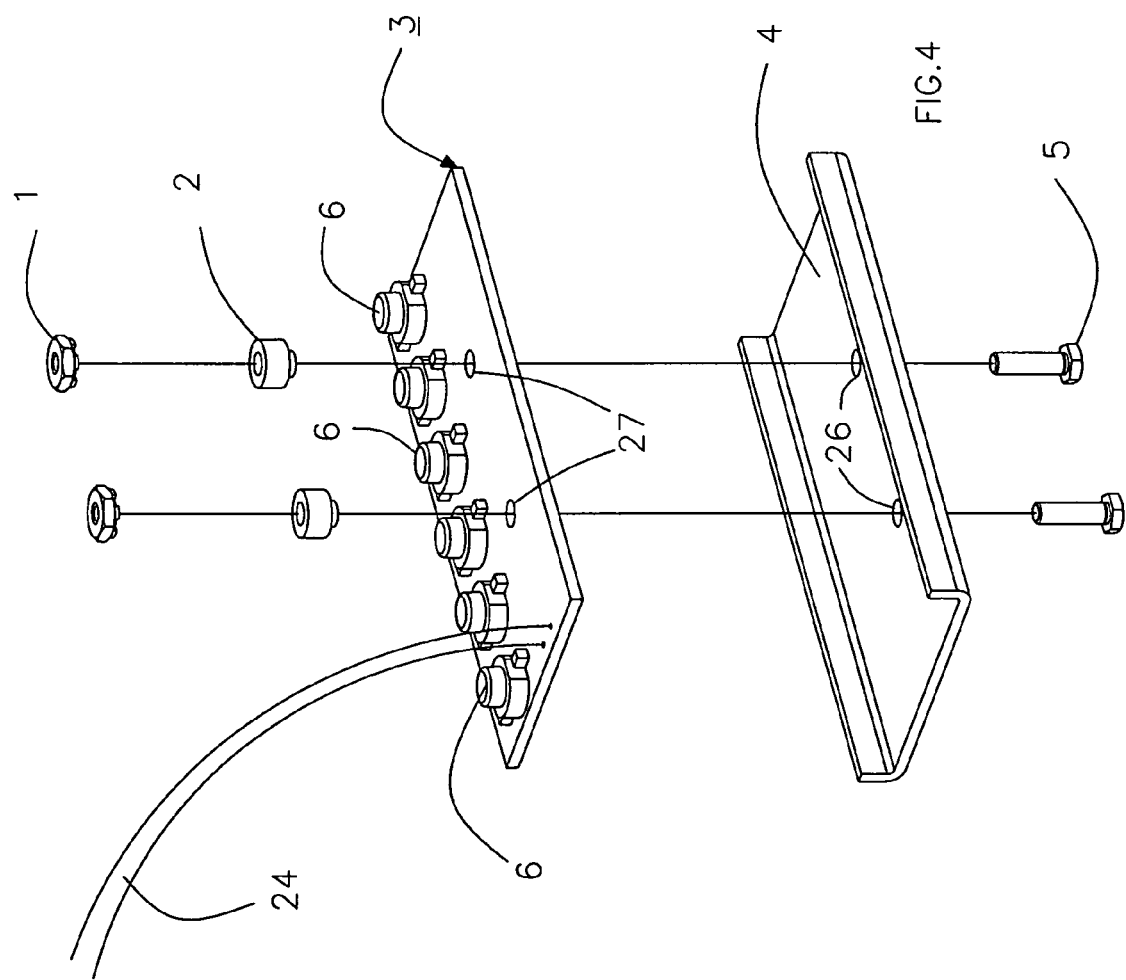

LIGHT EMITTER SUB-ASSEMBLIES ESPECIALLY CONTAINING AN ARRAY OF LIGHT EMITTING DEVICES (LEDS) AND MODULES CONTAINING SUCH SUB-ASSEMBLIES WHICH PROVIDE LIGHTING APPARATUSES, ESPECIALLY LIGHT BARS FOR MOUNTING ON A VEHICLE

Priority is claimed to U.S. Provisional Patent Application Ser. No. 60/713,612, filed Sep. 1, 2005.

DESCRIPTION

The present invention relates to light-emitting assemblies and particularly to a sub-assembly having a circuit board on which one or more light-emitting devices, such as LEDs, may be mounted, wherein the circuit board is potted in a tray with a heat-conductive potting compound so as to facilitate the dissipation of heat generated by the light-emitting devices via the potting compound and tray, thereby reducing the heating of the light-emitting devices so as to enable the devices to maintain their light output. The invention also provides a module which provides an external heat sink to which the tray is connected and which may extend around the tray to provide a reflective surface for collecting the light emitted by the light-emitting devices and projecting the light outwardly from the module. The invention further provides different types of light-emitting apparatuses such as light bars which may be mounted on the dash or to the inside of the windshield of the vehicle to provide warning illumination and of a type which may contain a plurality of such modules arranged adjacent to each other and within a transparent or translucent cover so as to provide a light bar which may be mounted on the vehicle.

The invention is especially suitable for use in lighting equipment where the light-emitting device is one or more LEDs. LEDs have a light output which decreases with the temperature of the LED. Thus, for example, the light output may decrease from 3 to 5 fold as the temperature at the light-emitting junction of the LEDs increases from approximately room temperature to 100° C. It is a feature of this invention to provide a sub-assembly containing the LEDs and a member which provides a heat-sink with which the sub-assembly may be connected, and especially a reflector of the light from the LEDs which provides the heat-sink, the sub-assembly and the reflector heat-sink being contained in a module.

While light bars of modular construction have heretofore been suggested, and are shown, for example, in the following U.S. Patents: Grosswiller, U.S. Pat. No. 4,189,709, issued Feb. 19, 1980; Green et al., U.S. Pat. No. 5,452,188, issued Sep. 19, 1995; and Stanuch et al., U.S. Pat. No. 5,884,997, issued Mar. 22, 1999, sub-assemblies and modules having efficient thermal transfer capability to dissipate heat from light-emitting devices, and which also can be adapted to provide lighting apparatus of different types is unique to the present invention. The lighting apparatus may be a light bar containing one module which is adapted to be mounted internally of a vehicle on the dash or inside of the windshield thereof or a light bar having a multiplicity of modules which is adapted to be mounted externally of the vehicle, such as across the roof thereof.

Briefly described, the sub-assembly includes one or more light-emitting devices such as an array of LEDs on a member supporting the devices. This member is preferably a printed circuit board which contains circuitry for connecting power to the LEDs and if desired, turning the power on and off to emit the light from the LEDs in flashes. A tray of heat-conductive material has the light-emitting device support member (the board therein), preferably on the floor of the tray so that a short thermal path (only the thickness of the board, which may be thermally conductive itself) extends to the tray. The board is encapsulated in the tray with a solidified body of potting material, such as thermally-conductive epoxy resin. The potting material body provides protection for the LEDs and circuitry against impact, shock, short circuits in the circuitry elements, vibration and corrosion. Protection is provided also against adverse environmental effects, such as moisture, chemical spills, and damage due to mishandling. A standoff insulator in the tray and through the board provides for the passage of a mechanical fastener device, such as a bolt, for assembling the sub-assembly to a heat-sink which dissipates the heat from the light-emitting devices through the tray and potting material body to the heat-sink.

In accordance with the invention, the heat-sink may be a part of a module, preferably where the heat-sink is the base of a reflector, such as a parabolic reflector. The base may have a slot which captures a head of the fastener device; namely the head of a bolt providing the device, which secures the module in heat transferring relationship to the base. Fins on the base may be provided to increase the dissipating surface of the heat-sink. An optical element such as a lens or diffuser may bridge the opening between the reflector and the base through which light is projected from the reflecting surface of the reflector.

A light bar may be provided by a housing having an opening in which the module is received. A bracket on the housing may provide a mounting for the light bar to the inside of the windshield of a vehicle while the housing may be seated on the dash of the vehicle. In any case, warning illumination is projected by the light bar from the inside of the vehicle.

Another light bar adapted to be mounted on the outside, such as the roof of the vehicle, contains a frame to which the modules may be assembled in side-by-side relationship around the edges of the frame on the ends, the sides, or both the ends and the sides of the frame, so as to provide omni-directional warning illumination. A transparent or translucent cover attached to the frame provides wind and water protection for the light bar. The modules may have LEDs of different colors and may be turned on and off in desired sequence so as to obtain a warning system of different color flashing illumination.

Accordingly, it is a principal object of the present invention to provide improved light-emitting assemblies containing sub-assemblies of light-emitting devices, such as LEDs, which maintains effective thermal transfer characteristics so that heat from the light-emitting devices is extracted away from the emitters (the LEDs) and may be dissipated effectively in a heat-sink external to and assembled with the sub-assembly.

It is a further object of the present invention to provide light-emitting sub-assemblies where light-emitting units such as LEDs mounted on circuit boards are encapsulated in trays which may be completely constructed to facilitate final assembly into a lighting apparatus or the trays may be removed from the subassemblies for repair or maintenance.

It is a still further object of the present invention to provide improved modules, including the sub-assemblies, and a heat-sink, and preferably a heat-sink provided by a reflector structure which collects the light from the light-emitting devices and also acts as a heat-sink to dissipate heat generated in the light-emitting devices.

It is a still further object of the present invention to provide modules which are assemblies of reflectors optical elements and light-emitting units which may readily be integrated and assembled with each other providing both directed light beams and maintaining light output, and preventing catastrophic failures of the LEDs by providing effective thermal transfer characteristics.

It is a still further object of the present invention to provide modules of light-emitting units and reflectors which may be assembled in housings and on frames to provide different types of light bars, for example, for use inside a vehicle and for providing omni-directional warning illumination when mounted on the outside of the vehicle.

The foregoing and other objects, features and advantages of the invention as well as presently preferred embodiments thereof will become more apparent from a reading of the following description in connection with the accompanying drawings in which:

FIG. 4 is an exploded view of the sub-assembly shown in FIGS. 1-3 in which the body of potting or encapsulating material is omitted;

Figure 1:
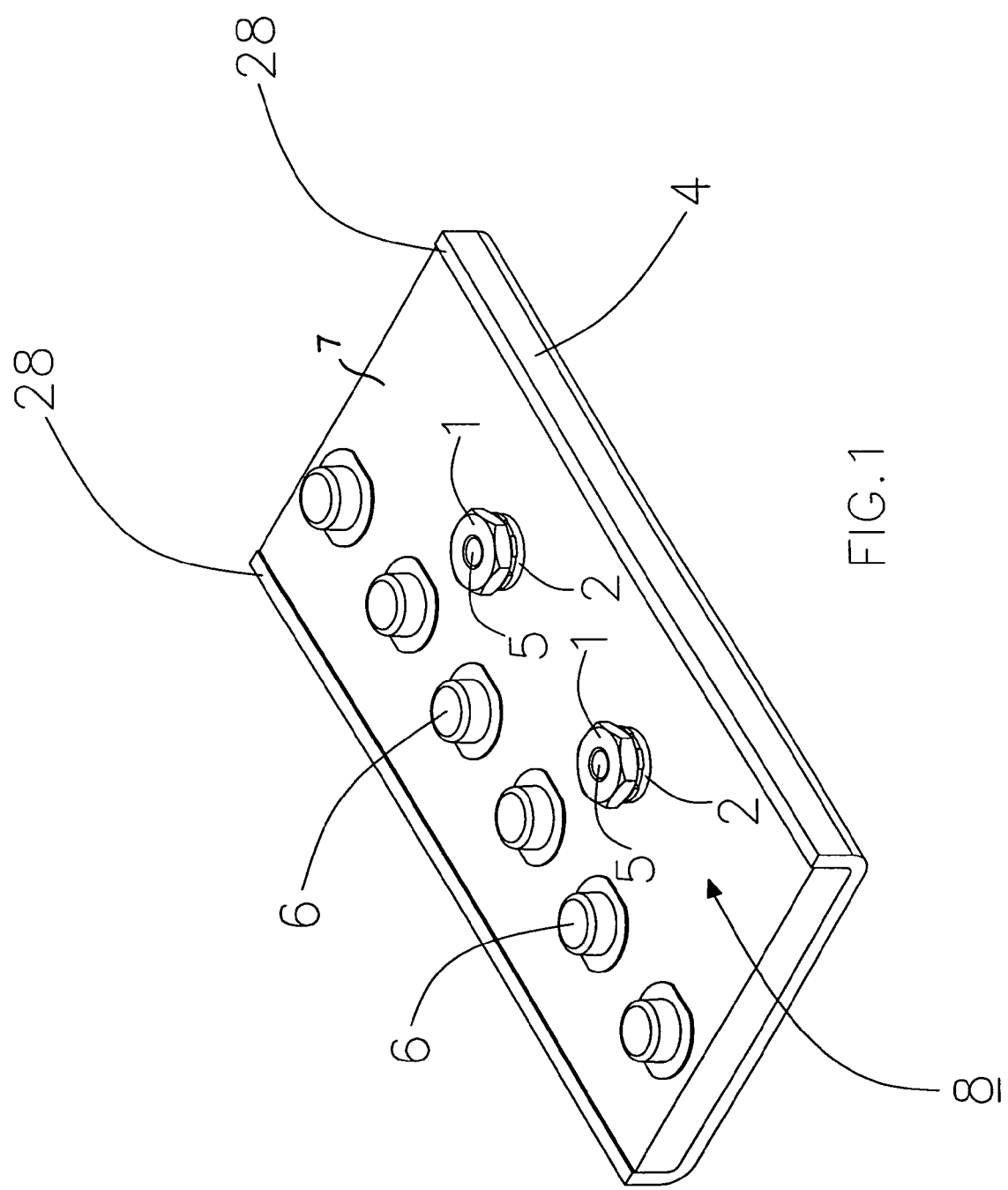
FIG. 1 is a perspective view from the top of a sub-assembly providing a light emitting unit containing an array of LEDs.
Figure 2:
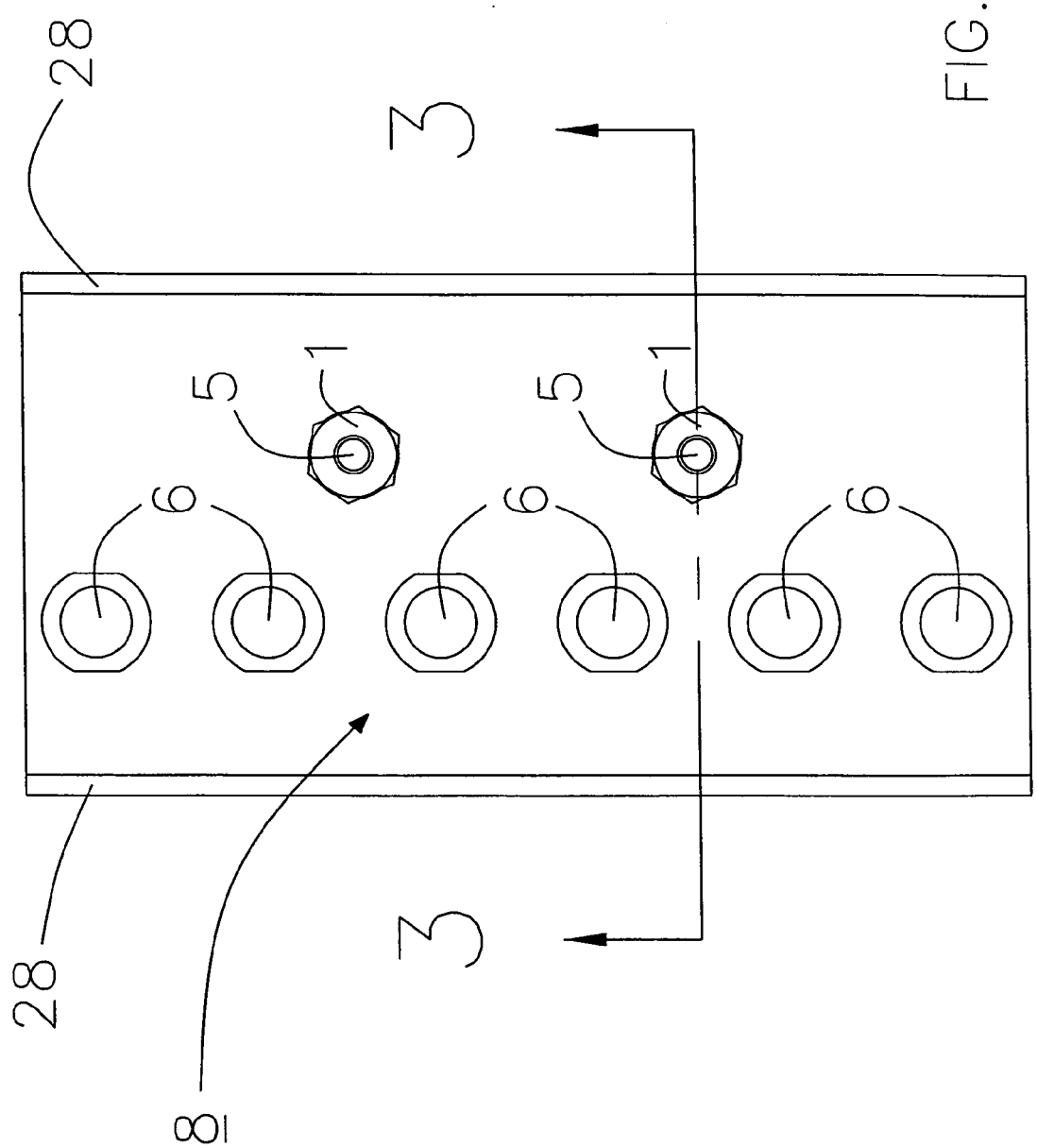
FIG. 2 is a plan view of the sub-assembly shown in FIG. 1.
Figure 3:
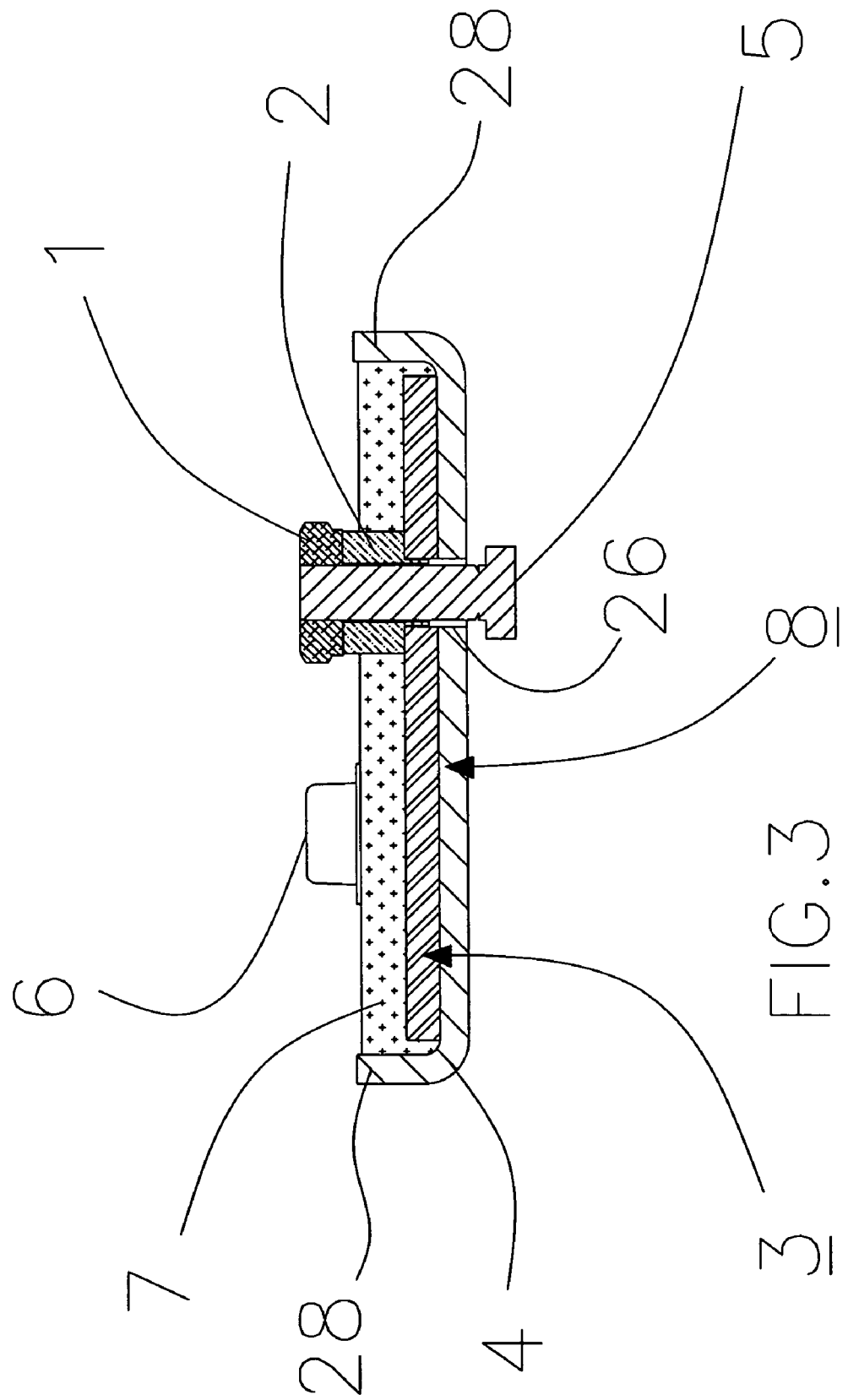
FIG. 3 is a sectional view of the sub-assembly shown in FIGS. 1 and 2 taken along the line 3-3 in FIG. 2.

Referring to FIGS. 1-4, there is shown a sub-assembly 8 containing light emitting devices 6. The devices are in a linear array in the sub-assembly 8. A circuit-board 3 (FIGS. 3 and 4) provides a support member on which the LEDs 6 are mounted. This circuit-board has circuits for communicating power applied to lines 24 (FIG. 4) to circuits printed on or internally of the board 3. These circuits may include components for flashing the light from the LEDs on and off. Alternatively, the flasher components may be mounted externally of the sub-assembly. The board 3 is thermally conductive as by having a core of thermally conductive material; e.g., metal. Thermal conductivity through the board 3, if made of phenolic material, may be provided by metal plated holes therethrough.

The circuit-board 3 with the LEDs 6 is disposed on the floor of a tray 4 with the side of the board 3 opposite to the side thereof on which the LEDs 6 are mounted disposed in contact with the floor of the tray 4. The tray 4 may be made of metal such as aluminum or of thermally conductive plastic, such as a thermally conductive plastic material; CoolPoly® D-Series Thermally Conductive plastic manufactured by Cool Polymers, Inc., of Warwick, R.I., being suitable. The tray 4 may be an extrusion open at the ends thereof. Alternatively, the tray may be a box 11 as shown in FIG. 4A.

Figure 4A:
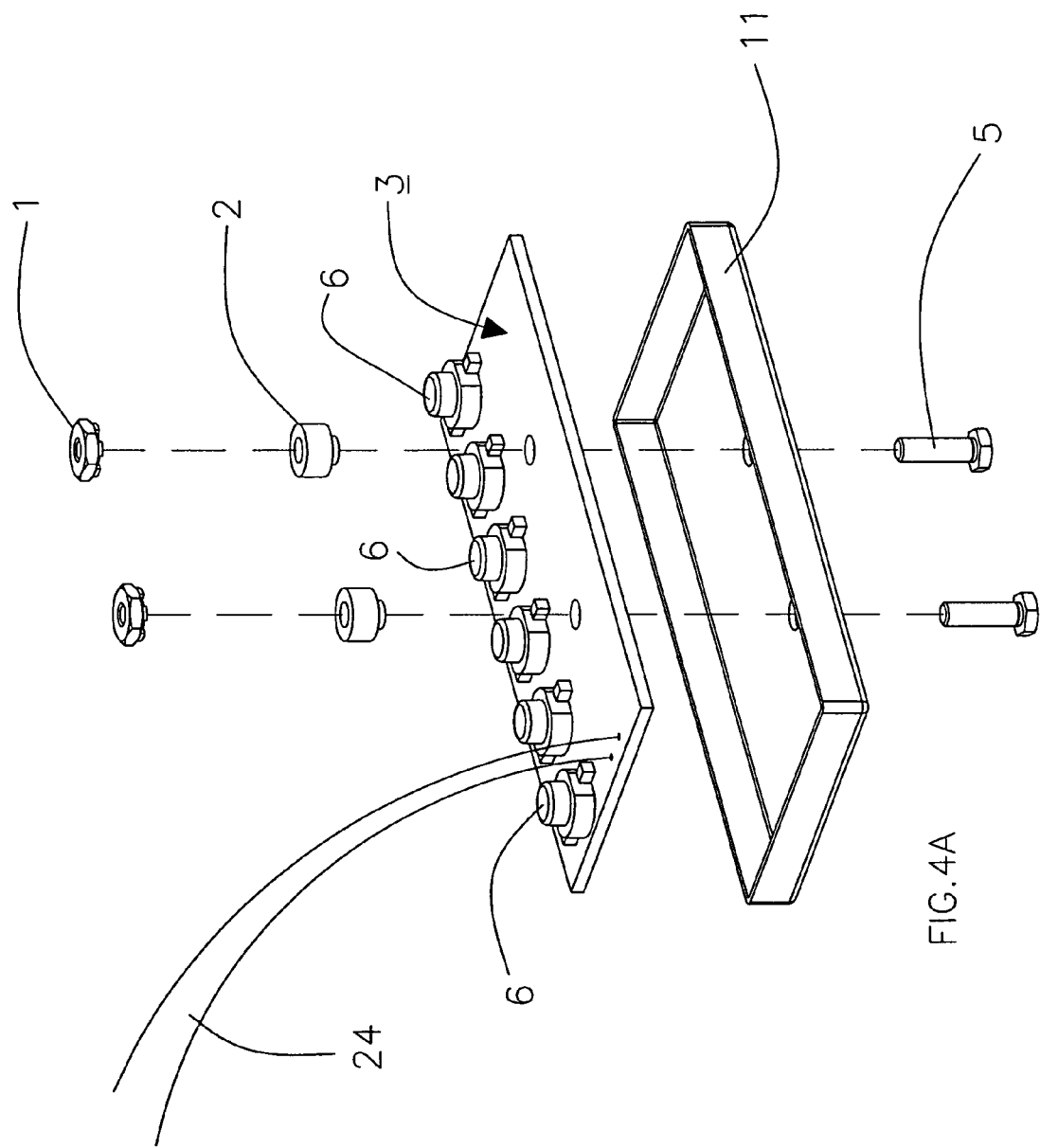
FIG. 4A is a view similar to FIG. 4 in accordance with another embodiment of the sub-assembly.

A pair of components for attaching or fastening the sub-assembly to a heat-sink (heat-dissipation) member, such as the base of a reflector unit 9 (which will be described hereafter, in connection with FIGS. 5-7) is inserted through aligned holes 27 and 26 in the board 3 and tray 4, respectively, as shown in FIG. 4 or board 3 and box 11 of FIG. 4A. The fastener devices are bolts 5, the heads of which extend beyond the bottom of the tray 4. The bolts also extend through collars which may be insulating step washers 2. The step washers rest on the board 3 and are of sufficient height to extend above the edges of the rims 28 of the tray 4. Lock nuts 1 are threaded on the bolts 5 and bear against the step washers 2. A body 7 of encapsulating material such as potting compound which is thermally conductive, as by including thermally conductive particles therein is disposed in the tray 4, filling the tray up to the edges of the rims and encapsulating the board 3, the LEDs 6 and the step washers 2. A suitable potting compound may be made from two part epoxy such as thermally-conductive Potting Compounds from EFI Polymers located in Denver, Colo. (Resin Part 11T202-20210, Hardener Part #7H002-50002 or thermally conductive Epoxy encapsulating and potting compound from MG Chemicals at 9347-193$^{rd}$ Street, Surrey, B.C., Canada V4N 4E7 (part 832-TC).

Since the board 3 provides a short path for heat generated in the LEDs during operation to the tray 4 and also since heat may be transmitted through the encapsulating body 7, the module enables the temperature of the LED light-emitting junctions to be sufficiently low such that the LEDs provide substantially their full rated light output and the light output does not deteriorate sufficiently to effect light-emitting operation of the LEDs in the sub-assembly 8.

The tray 4 or potting box 11 may be molded from a polymer, such as polyethylene, so that the tray can be removed and re-used or disposed of. The circuit board can be in direct contact with the heat sink, thereby reducing the thermal resistance. Thermal conductivity can further be improved by applying a thermally conductive grease, or using a thermally conductive pad between the board 3 and the floor of the tray and between the bottom of the tray 4 and the heat sink 30 (see FIG. 5), to substantially eliminate all air gaps. The resulting subassembly would have a potted circuit board that is essentially directly heat sunk so as to have especially desirable heat transfer characteristics.

Figure 5:
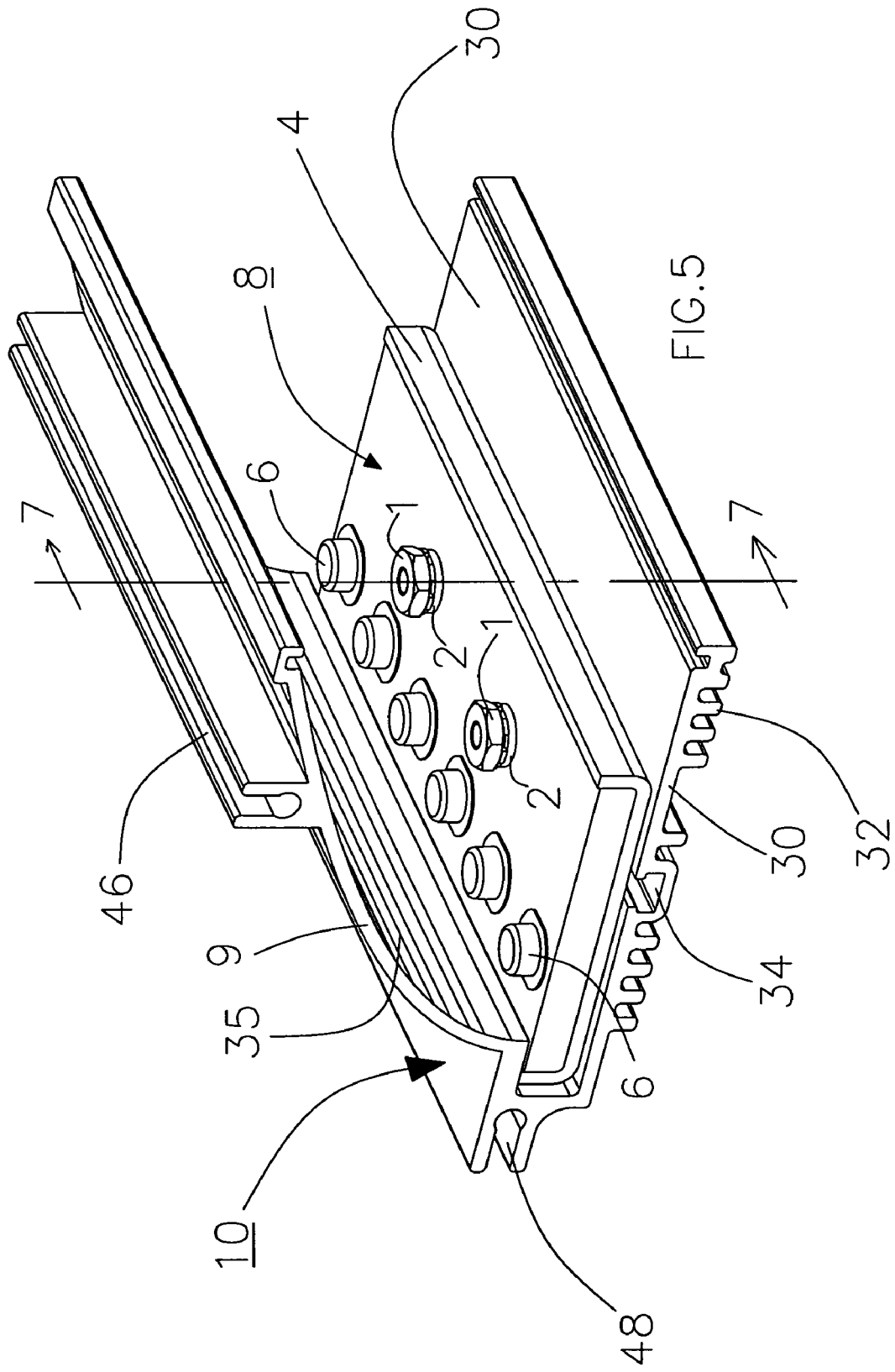
FIG. 5 is a perspective view of a light-emitter module including the sub-assembly shown in FIGS. 1-4.
Figure 6:
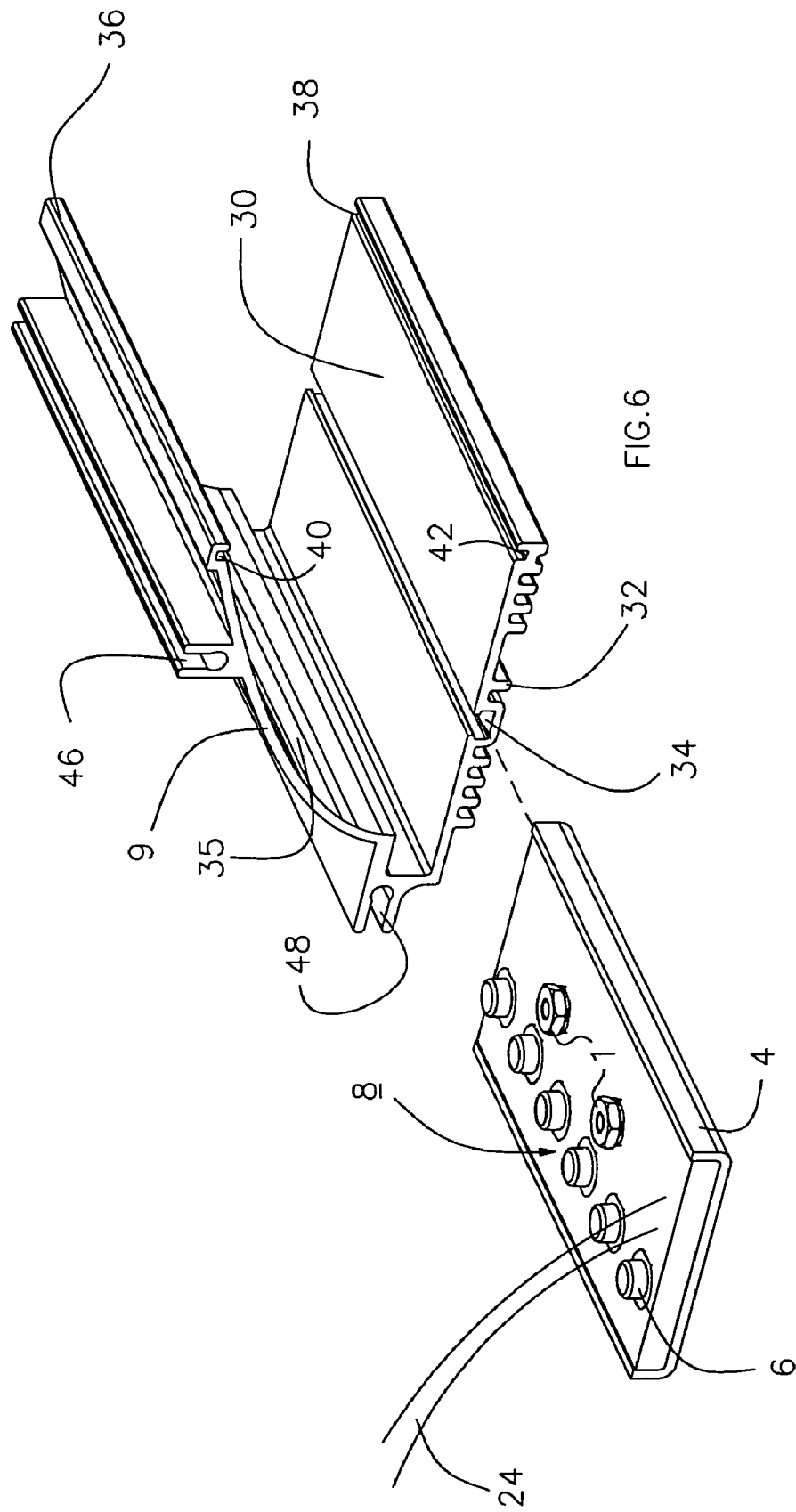
FIG. 6 is an exploded view illustrating the assembly of the sub-assembly shown in FIGS. 1-4 into the reflector heat-sink unit of the module shown in FIG. 5.
Figure 7:
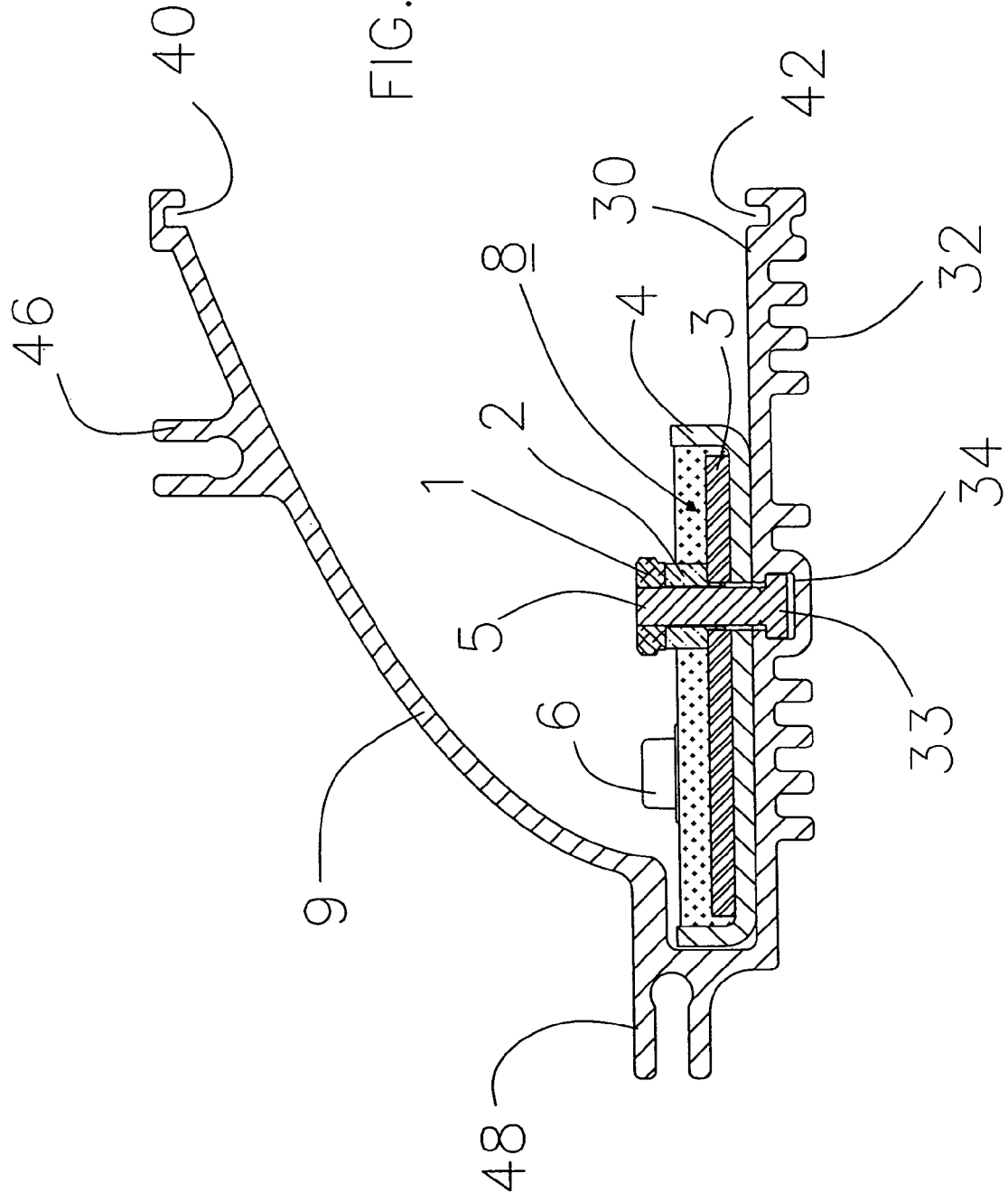
FIG. 7 is a sectional view of the module shown in FIG. 5 taken along the line 7-7 in FIG. 5.

Preferably, the sub-assemblies are mounted on a heat-sink member, such as the base 30 of the reflector in a module containing the sub-assembly 8, as shown in FIGS. 5-7. The sub-assemblies 8 may be fabricated so as to provide a supply or inventory thereof to be used in the assembly of modules and other devices utilizing the light emitted by the LEDs. In all such devices, it is preferable that the tray 4 be mounted on a heat-sink which may be equipped with heat-dissipating fins, such as the fins 32 extending from the outside of the base 30 of the reflector 9. Accordingly, the provision of separate LED sub-assemblies 8 in accordance with the invention facilitates mass-production of light-emitting modules and other devices such as light bars as and when ordered by a customer and makes the cost of such modules and light bars less than would be the case if the reflector or other heat-sink body had the circuit-board and its LED array encapsulated in a cavity therein.

Alternatively, the encapsulation or potting of the LEDs 6 and its mounting board 3 may be accomplished by filling a tray in the form of a box 11 as shown in FIG. 4A with the potting compound to effect encapsulation of the board 3 and the LEDs 6.

Figure 15:
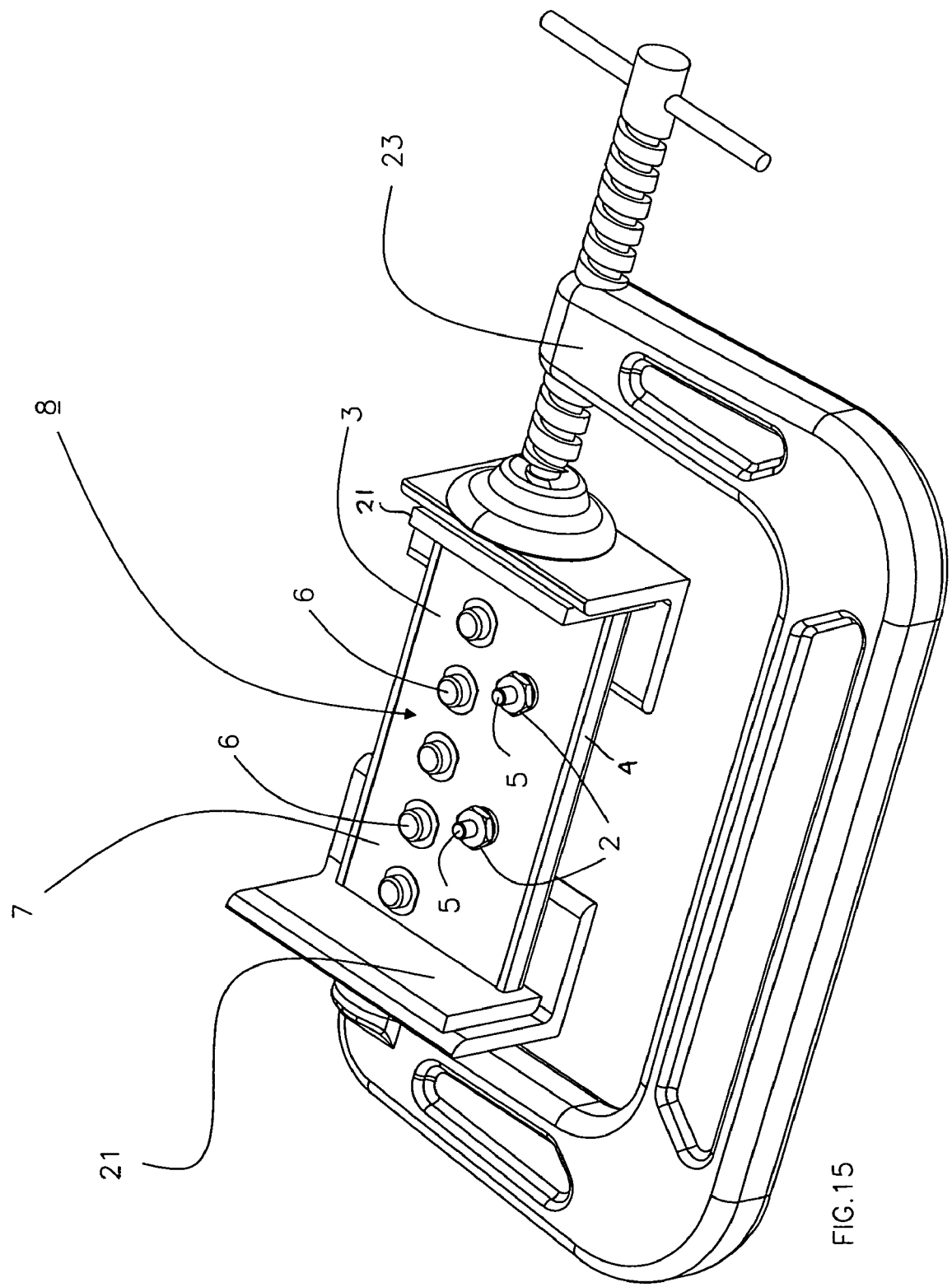
FIG. 15 illustrates tooling which is used in fabricating the sub-assembly shown in FIGS. 1-4 during potting (encapsulation) of the board supporting the light-emitting devices and the attachment bolts.

The board 3 carrying the LEDs 6 and the step washers 2 in the open ended tray 4 may be encapsulated or potted to encapsulate these components in the tray 4 with potting compound. As shown in FIG. 15, a clamping mechanism 23 is used to hold sealing rubber plates 21 against the ends of the tray. Then, the potting compound is dispensed into the tray 4 over the board 3 on the bottom of the tray and around the LEDs 6 and the step washers 2. The thermally conductive grease may, if used, be coated on the floor of the tray before the potting compound is dispensed. When the potting compound hardens into the encapsulating body 7, the completed potted sub-assembly 8 is released from the clamping mechanism 23.

Referring to FIGS. 5-7, there is shown how the sub-assembly 8 and a reflector 9 are assembled to provide a sub-assembly 10 thereof. The reflector may be made of metal, as by being an extrusion of aluminum or an extrusion of conductive polymer plastic, such as used for the tray 4 may be used. Then, a coating of reflective material, such as aluminum may be provided on the parabolic surface of the reflector 9.

The base 30 of the reflector 9 may have a T-slot 34 which receives the heads 33 (FIG. 7) of the bolts 5. When the lock nuts 1 are tightened against the step washers 2, the tray 4 is clamped tightly against the base 30 to provide intimate heat transfer relationship between the module 8 and the heat sink provided by the base 30.

Figure 11:
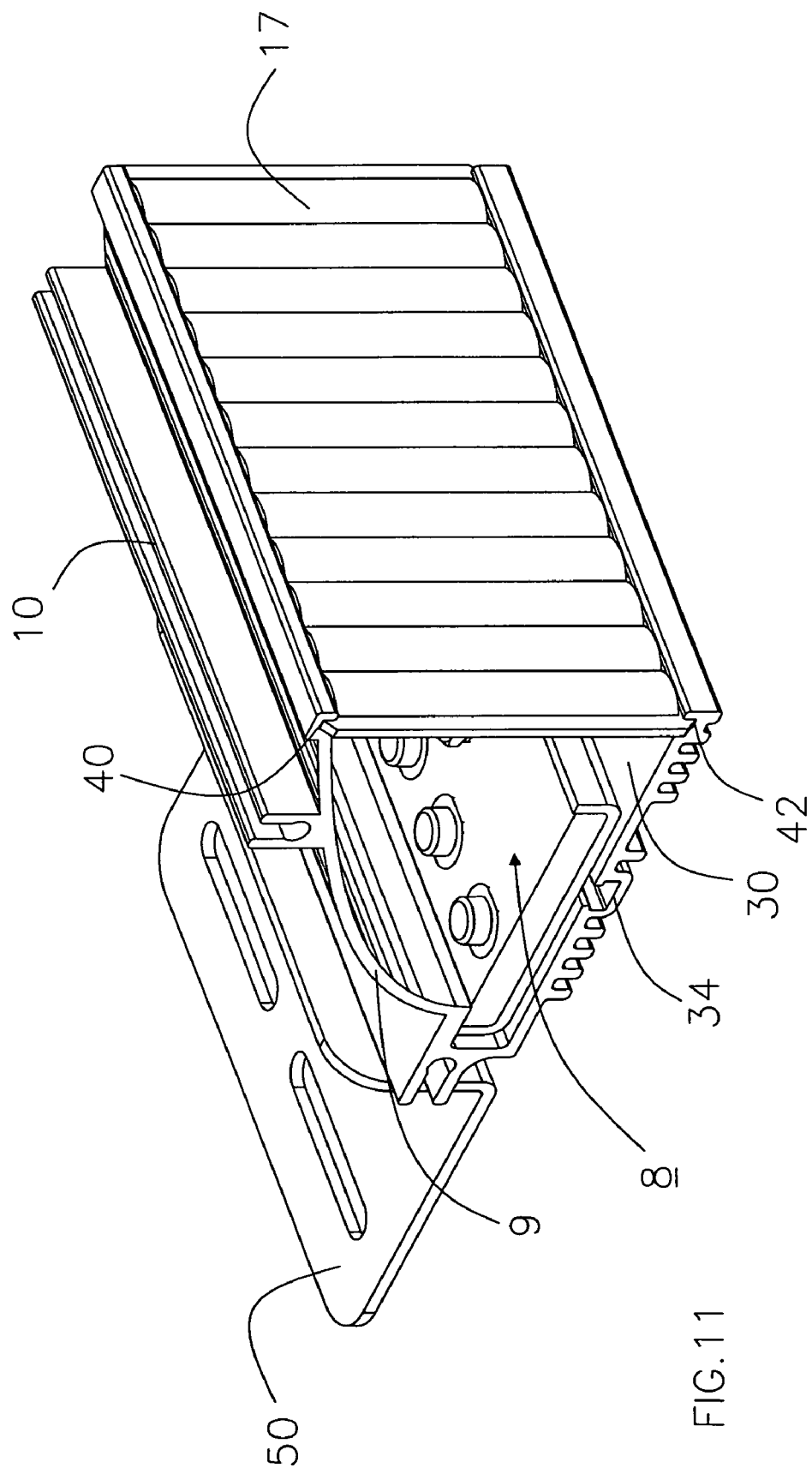
FIG. 11 is a perspective view of the module with optics in the light path from the reflector in the form of a vertical Fresnel lens or fluted optic and a bracket connected to the rear of the module.
Figure 12:
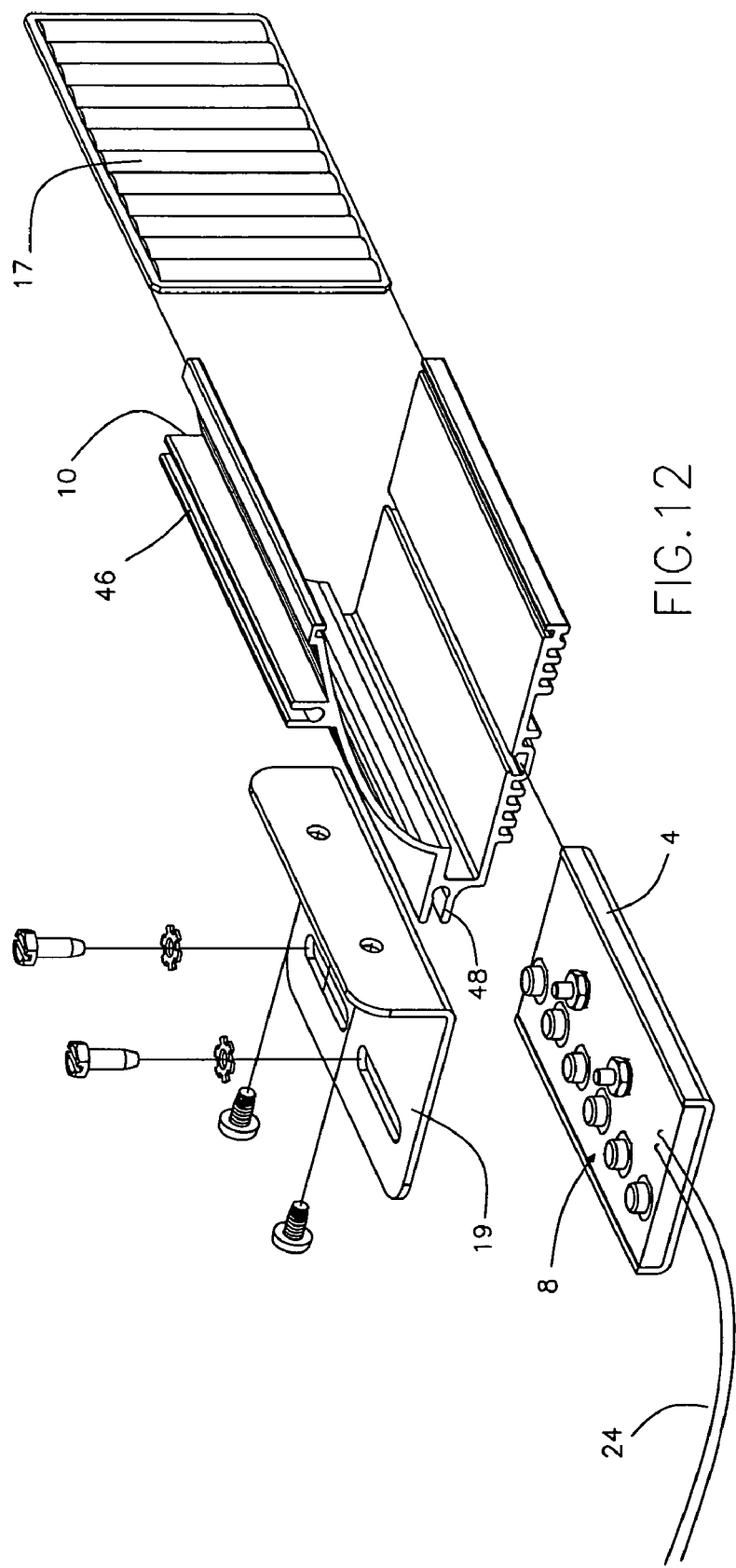
FIG. 12 is an exploded view of the module assembly shown in FIG. 11.

The edges 36 of the reflector 9 and the edge 38 of the base 30 of the reflector 9 define the opening from the sub-assembly 10 through which light generated by the LEDs 6 and reflected by the linear parabolic reflective surface 35 is projected out of the module. The edges 36 and 38 have grooves 40 and 42 which receive a lens, such as Fresnel lens, which provides diffusing or focusing optics 17. This lens may be molded of transparent optical plastic such as polycarbonate. Since the base 30 and reflective surface 35 portions of the reflector 9 are connected at their juncture opposite the opening in which the optic 17 is placed, these portions provide resilient force against the upper and lower edges of the optics 17 when located in the grooves 40 and 42 such that the optic 17 may be snapped in place in the module. The insertion of the optics 17 into the sub-assembly 10 as well as the assembly of the LED sub-assembly 8 is illustrated in FIGS. 11 and 12.

Figure 8:
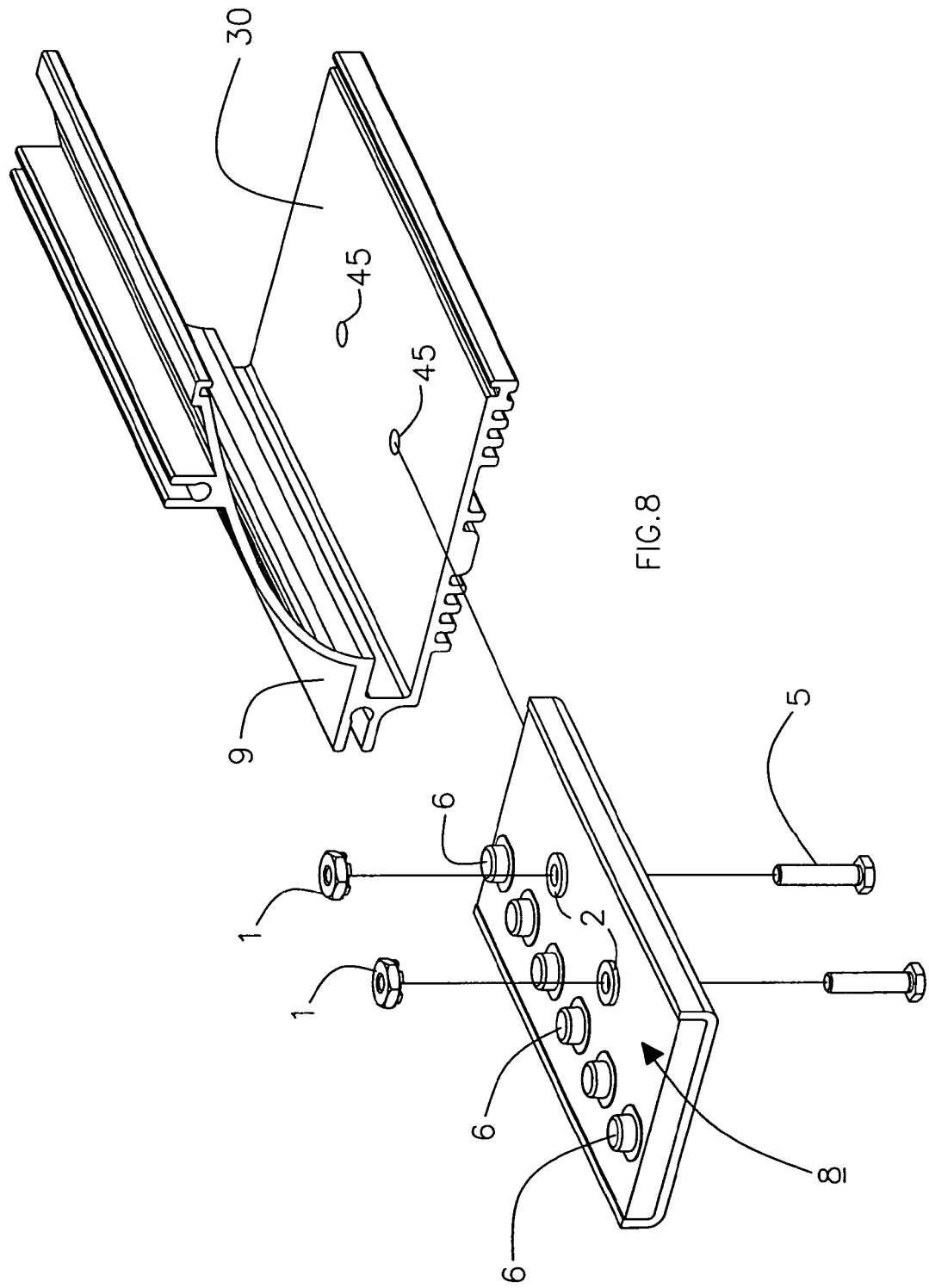
FIG. 8 is an exploded view showing how another embodiment of the module may be assembled.

As shown in FIG. 8, the LED sub-assembly 8 may be attached to the base 30 of the reflector 9 without the use of the T-slot 34 by providing holes 45 through which the bolts 5 extend through the step washers 2 to the lock nuts 1 which fasten the LED sub-assembly 8 in intimate heat-transferring relationship to the base 30 of the reflector 9.

The reflector 9 has tongues 46 and 48 extending outwardly from the rear and from the top thereof. These tongues have slots which form bulbs at the inside ends thereof. These grooved tongues facilitate the attachment of the assembled module into light bars, such as, for example, dash or inside window-mounted light bars as shown in FIGS. 9 and 10, or in FIGS. 13 and 14 where the light bar therein may be mounted on the roof of a vehicle, as is conventional with light bars such as shown in the above-referenced patents.

Figure 13:
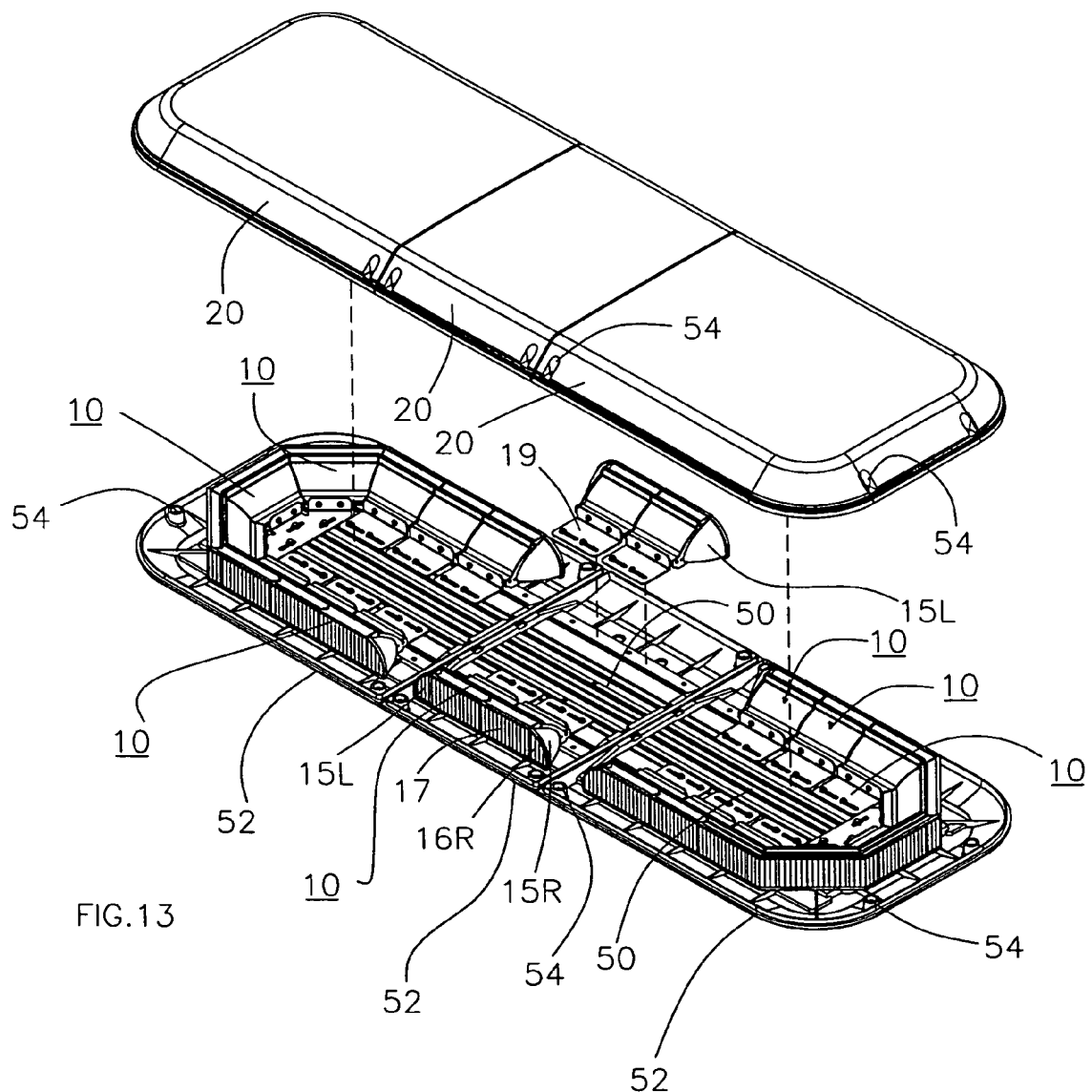
FIG. 13 is a perspective and partially exploded view illustrating a light bar suitable for mounting on the exterior of a vehicle to provide a warning light system and utilizing the light bar module shown in FIG. 11 assembled in side-by-side relationship along the sides and also along the ends of the light bar internally of a cover which shields the assembly from wind, rain, snow and ice.
Figure 14:
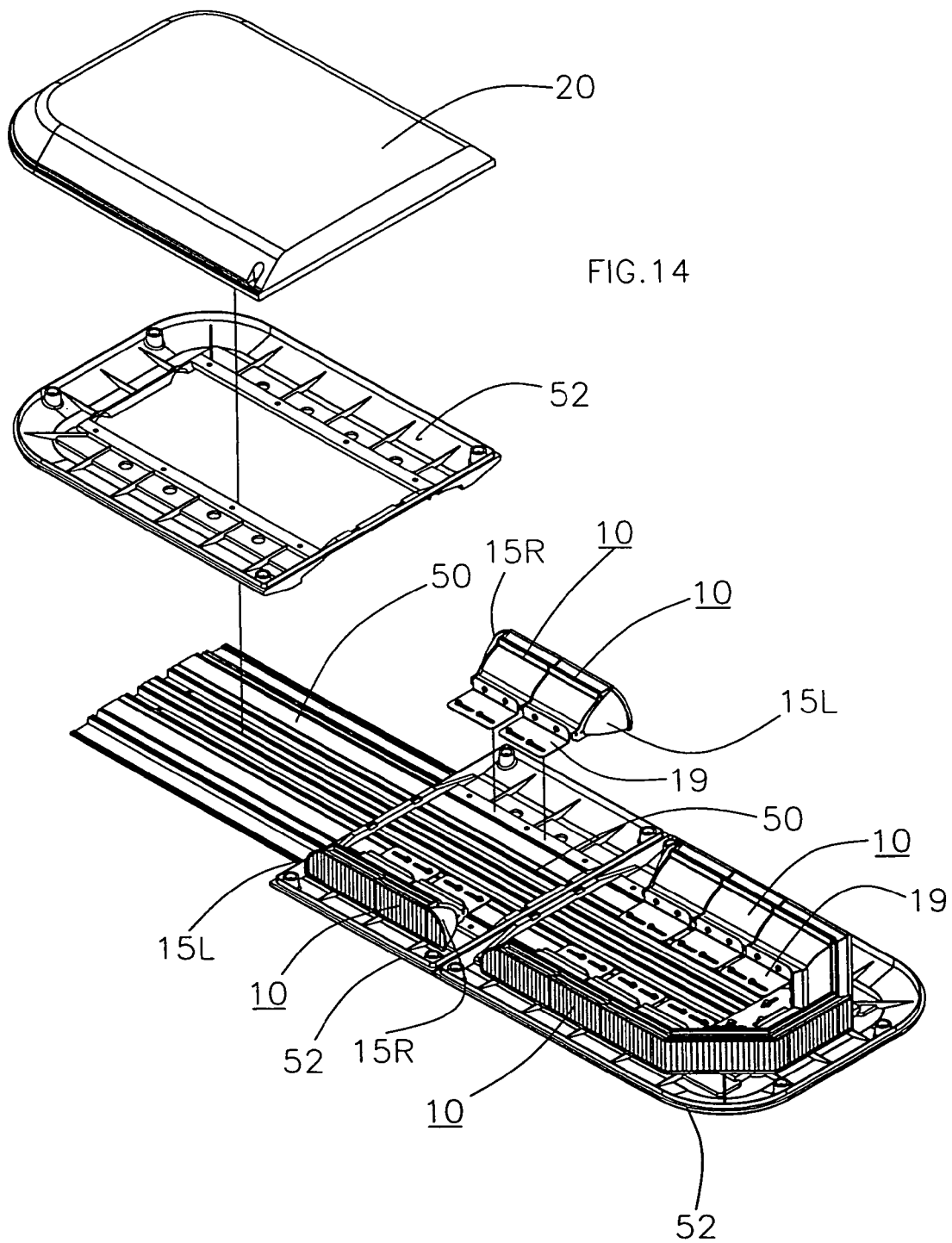
FIG. 14 is an exploded view illustrating the assembly of the light bar shown in FIG. 13.

The tongues may receive brackets which snap into the slots and are held by spring action of the walls of the tongue in the bulbous portion of the slot. Alternatively, and as shown in FIGS. 11 and 12, mounting brackets 19 can be screwed into the tongue 48. Such mounting brackets 19 enable a multiplicity of individual modules 10 to be mounted on members, which may be separate extrusions 50 that may be assembled on bottom frames 52, which can be assembled together to provide vehicular mountable light bars of desired length as shown in FIGS. 13 and 14. The frames 52 are covered by a transparent or translucent dome 20 which may be fastened together by bolts passing through aligned openings 54 in the cover 20 and frame 52 as shown in FIGS. 13 and 14.

Figure 10:
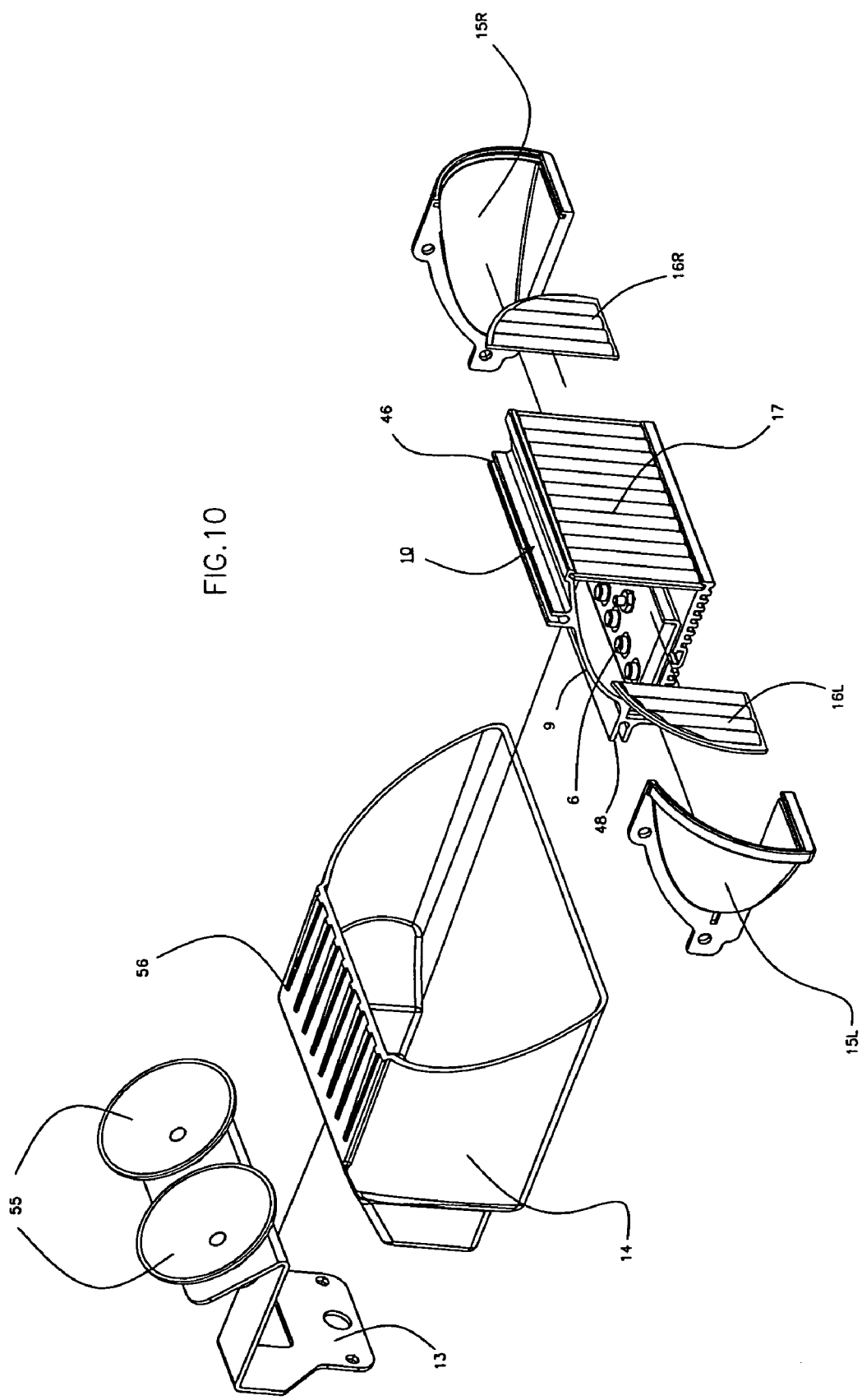
FIG. 10 is an exploded view illustrating the components of the light bar shown in FIG. 9.

As shown in FIG. 10, some of the modules 10 may have left and right end caps 15L and 15R which are attached to the tongues 46 and 48. These end caps have parabolic reflecting surfaces which extend parabolic reflecting surface of the reflector 9. The edges of these caps 15L and 15R may receive optics 16L and 16R, respectively, which extend the optics 17. These end caps and their optics may be only on one end of the module 9 so that such modules with one end cap may be brought together with modules which are mirror images thereof as shown in the center section of the frame 52 in the light bar of FIGS. 13 and 14.

Figure 9:
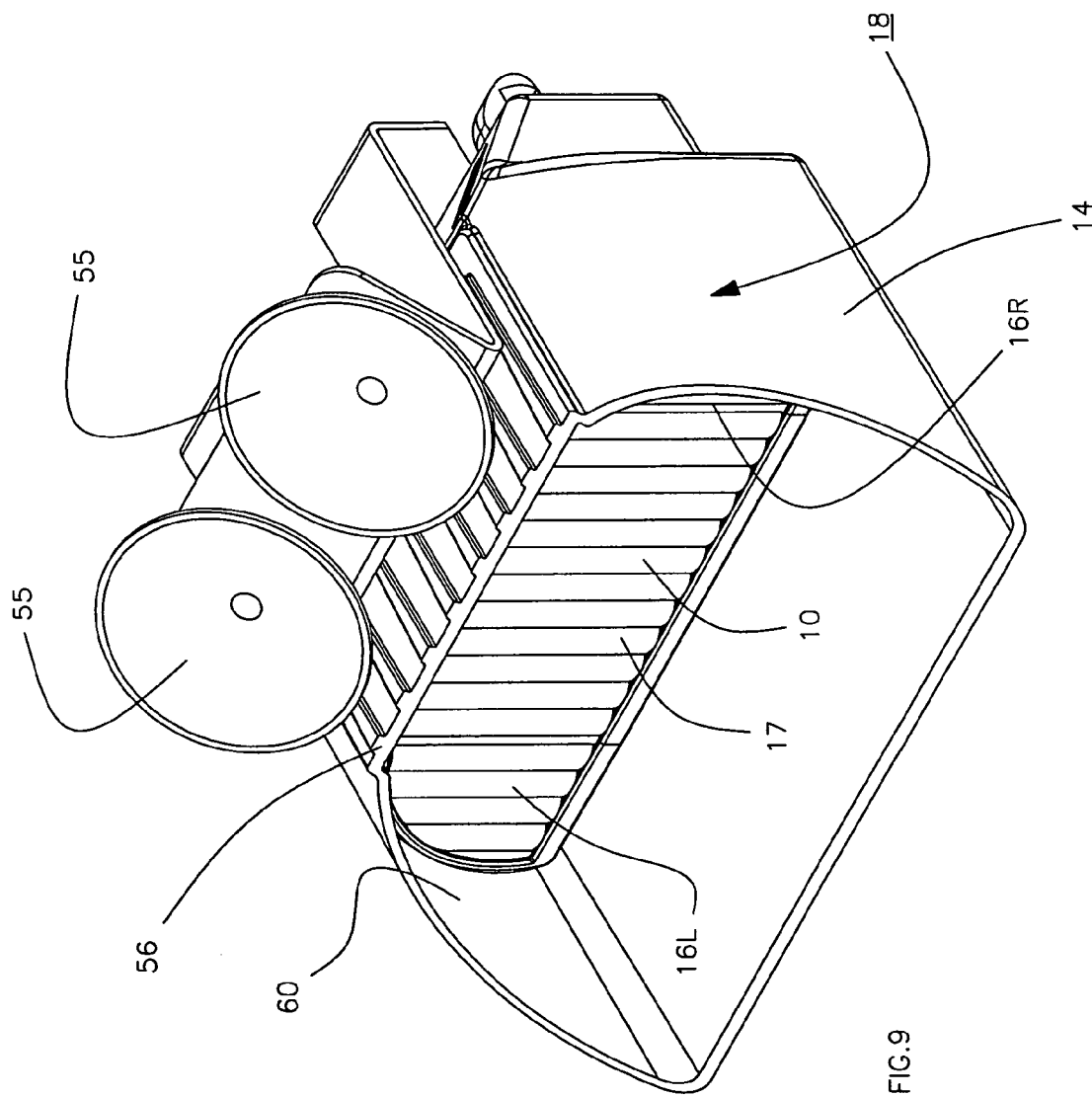
FIG. 9 is a perspective view of an interior light bar suitable for attachment to the inside of the windshield of a vehicle, which includes the modules illustrated in FIGS. 5-7 or 5, 6 and 8.

As shown in FIGS. 9 and 10, a light bar which is adapted to be mounted on the dash, preferably against the windshield and held in place by suction cups 55 is illustrated in FIGS. 9 and 10. A housing 14 which may be of plastic material, such as polypropylene and which is ribbed at 56 on the top thereof for aesthetic effect receives the module 10 with its end caps 15L and 15R and end cap lenses 16L and 16R. The rear of the housing 14 may have an opening through which a bracket 13 carrying the window suction cups 55 may extend into engagement with the grooves in the upper tongue 46 of the module 10. Alternatively, the bracket 13 may be screwed into the tongue 46 from the outside thereof. Light from the LEDs collected on the reflecting surface of the reflector 9 and end caps 15L and 15R is projected outwardly through the throat 60 so as to warn oncoming traffic.

It will be appreciated that the LED modules in the light bar of FIGS. 13 and 14 or even individual LEDs may emit light of different colors and in different sequences as dictated by flashing circuitry which is connected to the LED arrays in the modules or individual LEDs.

Variations and modifications in the herein described modules, sub-modules, and sub-assemblies and the various types of light bars into which they may be assembled will undoubtedly become apparent to those skilled in the art. Accordingly, the foregoing description should be taken as illustrative and not in a limited sense.

What is claimed is:

1. A light bar comprising a module including a light-emitting device mounted on a member supporting said device and including an electrical circuit connected to said device, a tray of heat-conductive material containing said member with said device exposed from said tray to generate light when operated, and a body in said tray holding said member in potted relationship therein, a heat dissipating member separate from said tray and providing a base to which said tray is attached in heat-conductive relationship, said heat dissipating member having a tongue providing an attachment fitting for said module; said light bar also having a housing having an opening in which said module is in disposed and connected via said attachment potting relationship to said opening to project light therethrough.

2. The light bar according to claim 1 wherein said module has an optical light conditioning element providing concentrating or diffusing effect, said element extending across said opening.

3. The light bar according to claim 1 wherein said tongue has a slot with walls which spring apart to receive said housing in snap in relationship in said tongue.

4. A light bar comprising a frame having an out side edge, a plurality of modules, each including a light-emitting device mounted on a member supporting said device and including an electrical circuit connected to said device, a tray of heat-conductive material containing said member with said device exposed from said tray to generate light when operated, and a body in said tray holding said member in potted relationship therein, said module also having a separate heat dissipating member providing a base to which said tray is attached in heat-conductive relationship, said heat dissipating member being provided with a tongue via which said module is attached to said frame along said edge along with others of said plurality of modules for projecting light outwardly from said frame, and a cover of light transmissive material enclosing said modules and said frame.

5. A light bar according to claim 4, wherein said modules each include an array of LED's, said LEDs being selected so that said arrays emit light of selected colors.

* * * * *